United States Patent [19]
Miyazaki

[11] Patent Number: 5,695,831
[45] Date of Patent: Dec. 9, 1997

[54] CVD METHOD FOR FORMING A METALLIC FILM ON A WAFER

[75] Inventor: Kazuki Miyazaki, Tokyo, Japan

[73] Assignee: NEC Corporation, Tokyo, Japan

[21] Appl. No.: 597,037

[22] Filed: Feb. 5, 1996

[30] Foreign Application Priority Data

Feb. 3, 1995 [JP] Japan ................................ 7-039001

[51] Int. Cl.$^6$ ................................................ C23C 16/08
[52] U.S. Cl. ........................ 427/576; 427/253; 427/255.1; 427/584
[58] Field of Search ........................ 427/253, 255.1, 427/576, 584

[56] References Cited

U.S. PATENT DOCUMENTS

| | | | |
|---|---|---|---|
| 4,659,591 | 4/1987 | Gärtner et al. | 427/253 |
| 5,175,017 | 12/1992 | Kobayashi et al. | 427/8 |
| 5,273,778 | 12/1993 | Yoshimoto et al. | 427/122 |
| 5,328,722 | 7/1994 | Ghanayem et al. | 427/250 |
| 5,433,975 | 7/1995 | Roberts et al. | 427/253 |

FOREIGN PATENT DOCUMENTS

| | | |
|---|---|---|
| 61-157681 | 7/1986 | Japan . |
| 63-14871 | 1/1988 | Japan . |

OTHER PUBLICATIONS

Prabhu, "Vapor Deposition with Unsaturated Hydrocarbons", IBM Technical Disclosure Bulletin, vol. 13, No. 12, May, 1971.

Tang et al., "Solid State Technology", Mar., 1983, pp. 125-128.

*Primary Examiner*—Shrive Beck
*Assistant Examiner*—Timothy Meeks
*Attorney, Agent, or Firm*—Foley & Lardner

[57] ABSTRACT

A CVD method for forming a tungsten (W) film, by using a metallic halide ($WF_6$) as a source gas, on a barrier metallic film containing titanium (Ti). The method includes providing to the edge portion of a wafer a mixed gas containing Ar gas as an inactive gas and a first gas capable of reacting with the halogen atoms in the metallic halide. The first gas is selected from a group consisting of ethylene, acetylene, butene, propylene, a substitute product thereof, and silane, which have $\pi$ electrons for activation of reaction with the halogen atoms. When an ethylene gas is used in the mixed gas, the the ethylene gas preferably flows at a flow rate of 2 to 7 percent of the flow rate of the Ar gas flowing at a rate of 1000 to 3000 sccm.

18 Claims, 4 Drawing Sheets

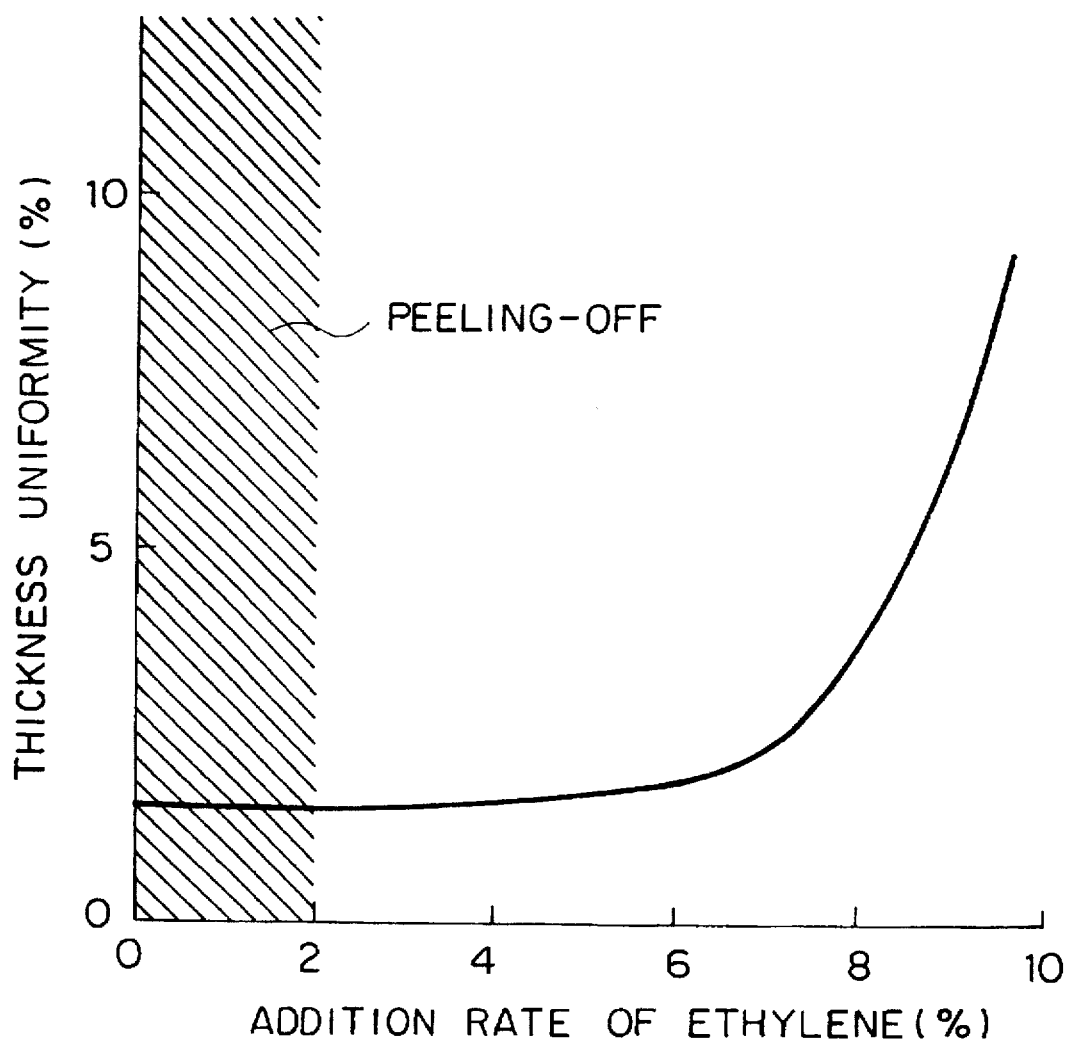

CVD METHOD FOR FORMING A METALLIC FILM ON A WAFER

BACKGROUND OF THE INVENTION

(a) Field of the Invention

The present invention relates to an equipment and a method for chemical vapor deposition (CVD) of a metallic film.

(b) Description of the Related Art

A conventional equipment and method for CVD of a metallic film will be described with reference to FIG. 1A showing a cross-sectional view of a conventional CVD reactor. In FIG. 1A, a Si wafer 1 mounted on a susceptor 2 is opposed to a showerhead 3 for supplying a source gas 4 to the Si wafer 1 in the CVD reactor 11. An inactive gas 9 is further supplied from backside of the Si wafer 2 in the CVD reactor 11. A shower ring 8 encircling the Si wafer 2 is provided between the showerhead 3 and the Si wafer 2 to guide the flow of the inactive gas 9 for suppressing deposition of the metallic film onto the edge region of the Si wafer 1. The shadow ring 8 can be omitted, if desired, and the inactive gas 9 may be directly supplied in the vicinity of the edge portion of the Si wafer 1.

FIG. 1B is an enlarged cross-sectional view in an encircled section A of FIG. 1A in the vicinity of the edge of the Si wafer 1. On the Si wafer 1, a barrier laminate including consecutively a low resistivity refractory metallic film 6 made of titanium (Ti) and a refractory metallic film 7 made of titanium nitride (TiN) acting as a barrier metal is formed by a continuous deposition method before deposition of the tungsten film 5. The low resistive Ti film 6 and the barrier TiN film 7 are formed for improving adherence of the tungsten film 5 onto the Si wafer 1.

Before deposition of the tungsten film 5 on the Ti/TiN barrier laminate 6 and 7, the Si wafer 1 is heated by the susceptor 2 up to a temperature between about 350° and 500° C. The source gas 4 for tungsten (W) deposition is directed downward as shown by dotted arrow while the inactive gas 9 such as argon gas is directed upward as shown by solid arrow in FIG. 1B, the inactive gas 9 passing the gap between the shadow ring 8 and the Si wafer 1 to prevent deposition of the tungsten onto the edge region of the Si wafer 1. The source gas 4 containing tungsten fluoride ($WF_6$) at a rate between 10 and 100 sccm (standard cubic centimeter per minute) and a reducing $H_2$ gas at a rate between 100 and 2000 sccm is supplied to the Si wafer 1 by way of the showerhead 3.

In the conventional method as described above, the Ti/TiN laminate is formed by sputtering onto the Si wafer 1 prior to CVD of the tungsten film 5. Just after the sputtering of Ti/TiN films 6 and 7, the edge of the Ti film 6 is often exposed in the vicinity of the edge portion of the TiN film 7 due to misalignment of both the films 6 and 7 or due to the undesirable thin edge portion of the TiN film 7, as shown in FIG. 1B. When the deposition of the tungsten film 5 is effected by using $WF_6$ as a source gas under the state of exposure of the Ti film 6, the following reaction:

$$Ti + 4F \rightarrow TiF_4 \uparrow \qquad (1)$$

will arise to cause peeling-off of the Ti film 6 and the resultant CVD tungsten film 5 from the Si wafer 1.

The peeling-off of the Ti film 6 and the resultant peeling-off of the CVD tungsten film 5 contaminate inside of the CVD reactor 11 or other reactor and equipment for the later process, causing adherence of the Ti or tungsten onto the Si wafer 1 to reduce reliability of the semiconductor device manufactured by the process. Thus, the production yield of the semiconductor device is reduced.

It may be considered that the flow rate of argon gas 9 should be increased in order to suppress the undesirable reaction as described above. However, thickness uniformity in the resultant CVD tungsten film 5 will be substantially lost by the increase of the flow rate of the argon gas 9. Namely, there is a limit in the flow rate of the argon gas, i. e., it should be limited below or equal to about 3000 sccm.

SUMMARY OF THE INVENTION

In view of the foregoing, it is therefore an object of the present invention to provide an improved equipment and a method for deposition of a metallic film, in which reaction of a halogen atoms such as fluorine with metallic atoms is suppressed to prevent peeling-off of the underlying Ti film overlying a wafer.

In accordance with the present invention there is provided a CVD reactor comprising mounting means for mounting a wafer thereon, a first tube for introducing a source gas containing a metallic halide to the wafer, decomposing means for decomposing at least a part of the metallic halide to generate a decomposed gas including metallic atoms and halogen atoms, a second tube for introducing a mixed gas containing an inactive gas and a first gas capable of reacting with the halogen atoms, and a supply means for supplying at least the decomposed gas and the mixed gas to the wafer to form on the wafer a metallic film composed of the metallic atoms.

The present invention also provides a CVD method for forming a first metallic film on a second metallic film containing titanium (Ti). The method includes the steps of introducing a source gas containing a metallic halide, decomposing at least a part of the metallic halide to generate a decomposed gas including metallic atoms and halogen atoms, introducing a mixed gas containing an inactive gas and a first gas capable of reacting with the halogen atoms, and supplying at least the decomposed gas and mixed gas to the wafer to form the first metallic film made of the metallic atoms.

With the present invention, the halogen atoms generated from the metallic halide is reacted with the first gas so that the halogen atoms are scarcely reacted with Ti atoms in the underlying Ti film so that peeling-off of the Ti film or resultant metallic film is prevented by the reaction of the halogen atoms with the first gas, thereby providing a high reliability and production yield of the CVD metallic film. The decomposing means may be a heater, plasma generator or light emitting means.

BRIEF DESCRIPTION OF THE DRAWINGS

FIG. 3 is a graph showing a relationship between concentration of an organic compound and a thickness uniformity of the metallic film in the first embodiment.

DESCRIPTION OF THE PREFERRED EMBODIMENTS

Figure 1A:
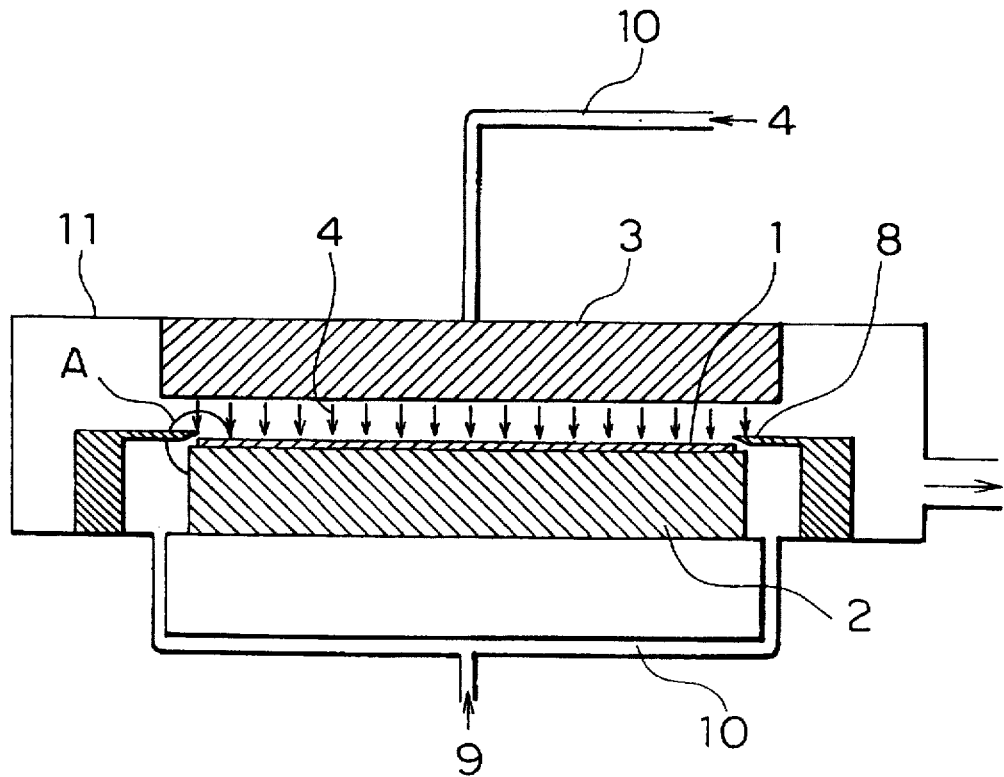
FIG. 1A is a cross-sectional view of a conventional CVD reactor including a Si wafer.

Now, the present invention will be described in more detail by way of preferred embodiments thereof with reference to the accompanying drawings, in which similar elements or elements having similar functions are designated by the same or similar reference numerals throughout the drawings.

Figure 1B:
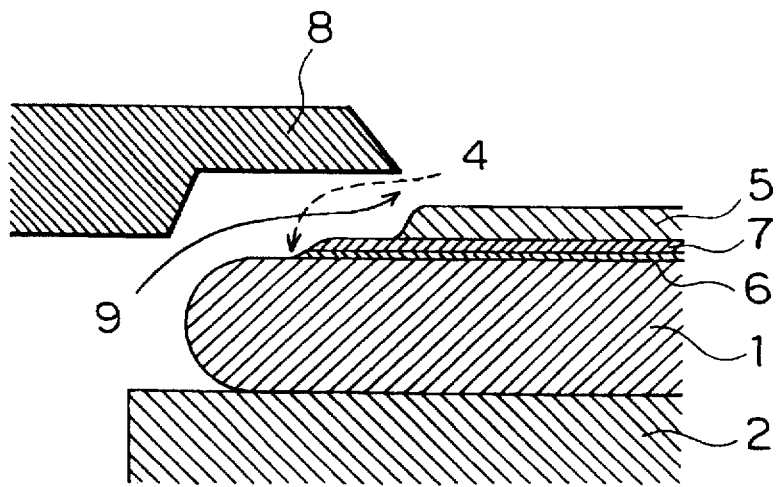
FIG. 1B is an enlarged cross-sectional view in a section encircled in FIG. 1A.
Figure 2A:
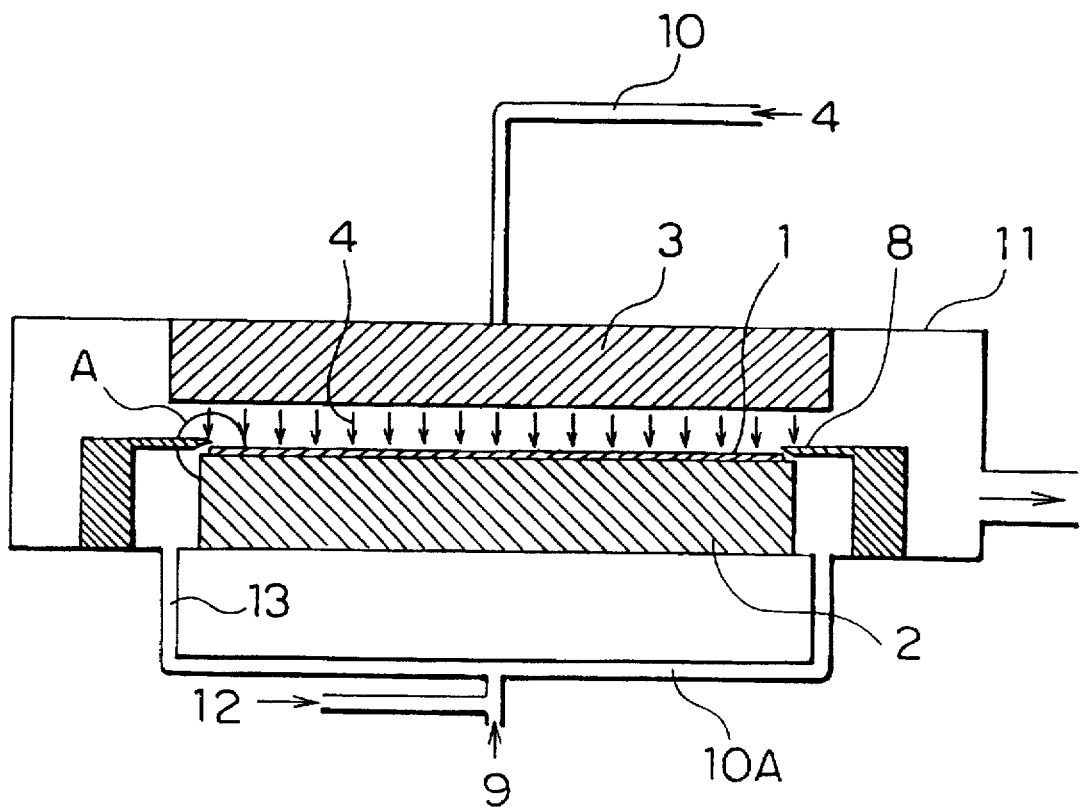
FIG. 2A is a cross-sectional view of a CVD reactor according to a first embodiment of the present invention.
Figure 2B:
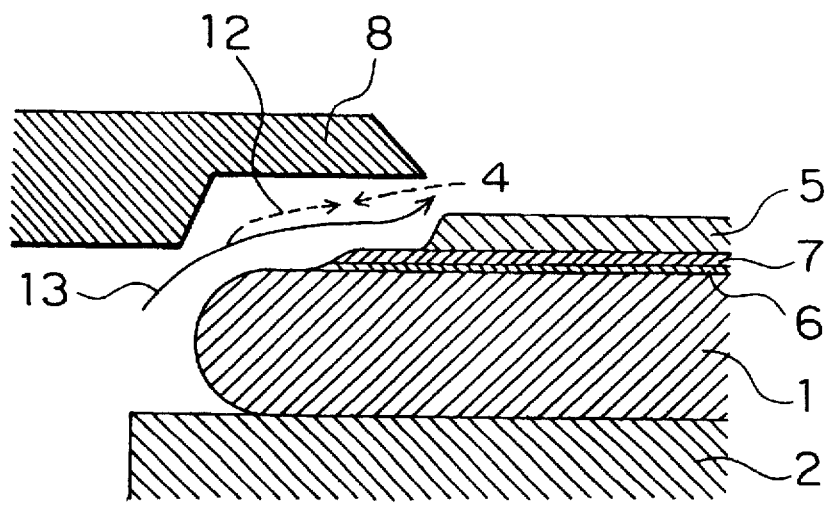
FIG. 2B is an enlarged cross-sectional view in a section encircled in FIG. 2A.

Referring to FIGS. 2A and 2B showing, similarly to FIGS. 1A and 1B, a CVD reactor according to an embodiment of the present invention, a Si wafer 1 having a desired circuit formed thereon is mounted on a susceptor 2 installed in the CVD reactor 11. The Si wafer 1 is heated up to a predetermined temperature between about 350° and 500° C. by the susceptor 2 before deposition of a tungsten film 5. A source gas 4 containing $WF_6$ at a rate of 10 to 100 sccm and a reducing $H_2$ gas at a rate of 100 to 2000 sccm is supplied to the Si wafer 1 by way of the showerhead 8, to deposit a tungsten film 5 onto a barrier metallic laminate including a Ti film 6 and a TiN film 7 consecutively formed on the Si wafer 1.

During the deposition of the tungsten film 5, a mixed backside gas 13 including an inactive gas 9, such as argon gas, at a rate of 2000 sccm and an ethylene gas 12 having active electrons such as $\pi$ electrons is supplied from the rear surface of the Si wafer 1, the mixed backside gas 13 passing through the gap between the shadow ring 8 and the Si wafer 1. The ethylene gas 12 is supplied, through tube 10A, at the rate of about 2 to 7 percent of the flow rate of the the inactive gas 9. The ethylene gas 12 provides active electrons such as $\pi$ electrons to the source gas 4 to enhance reaction of the halogen atoms with the ethylene gas 12. The shadow ring 8 is provided for passing the mixed backside gas 13 between the same and the Si wafer 1 to thereby suppress deposition of the tungsten film 5 onto the edge portion of the Si wafer 1. The flow rate of the argon gas may be in the range of 1000 to 3000 sccm.

As shown in FIG. 2B, the edge of the Ti film 6 is often exposed in the vicinity of the edge portion of the TiN film 7 due to misalignment of both the films. The Ti atoms in the Ti film 6 are likely to react with fluorine (F) atoms contained in and decomposed from the $WF_6$ source gas 4, if the ethylene gas 12 is not introduced. Fluorine atoms are produced in a small amount as by-products of the reaction of the $WF_6$ source gas effected by heating in the reactor 11 and are diffused to flow in the direction opposite to the flow direction of the mixed gas. The fluorine atoms produced in the source gas 4 are reacted with ethylene gas 12 providing active electrons as follows:

$$CH_2 + 2F \rightarrow CH_2F\text{—}CH_2F\uparrow. \qquad (2)$$

Accordingly, fluorine atoms reacting with Ti atoms in the Ti film 6 are reduced by the reaction. The decomposition of the source metallic halide gas into metallic atoms and halogen atoms may be effected by a plasma or a light instead of the heating.

FIG. 3 shows the relationship between the addition rate (percent) of the ethylene gas 12 with respect to the inactive gas 9 by flow rate and thickness uniformity of the resultant CVD film. As will be readily understood from FIG. 3, in the lower range of the addition of the ethylene gas 12, i.e., below about 2 percent of the ethylene flow rate with respect to the flow rate of the inactive gas, the resultant tungsten film exhibited peeling-off of the tungsten film from the Si wafer. On the other hand, if the addition rate of the ethylene gas is too high, i.e., above about 7 percent with respect to the flow rate of the inactive gas, thickness uniformity of the resultant CVD tungsten film is substantially lost. Accordingly, in the preferred range of the embodiment, the ethylene gas is added in an flow rate of about 2 to about 7 percent of the flow rate of the inactive gas such as argon gas.

Figure 4A:
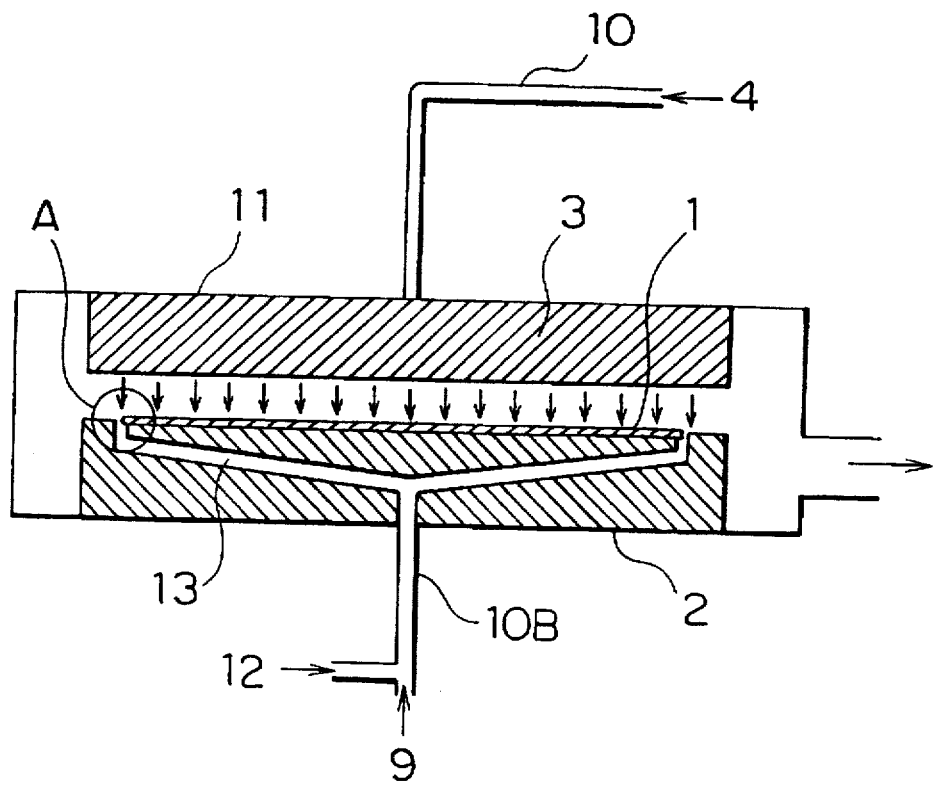
FIG. 4A is a cross-sectional view of a CVD reactor according to a second embodiment of the present invention.
Figure 4B:
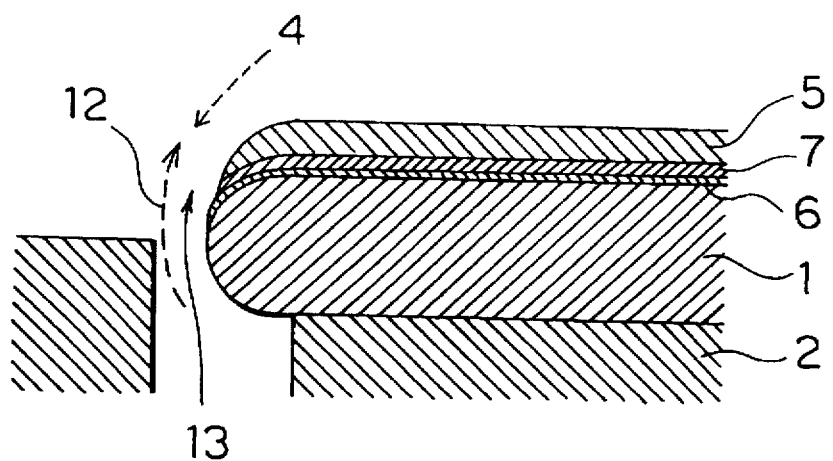
FIG. 4B is an enlarged cross-sectional view in a section encircled in FIG. 2A.

FIGS. 4A and 4B show, similarly to FIGS. 2A and 2B, a CVD reactor according to a second embodiment of the present invention. Also in this embodiment, a CVD tungsten film 5 is to be deposited onto Ti/TiN films 6 and 7 formed on a Si wafer 1 mounted on a susceptor 2 installed in a CVD reactor 11. The CVD reactor 11 includes no shadow ring provided between the showerhead 3 and the St wafer 1. The tube 10B is installed within the susceptor 2 mounting the Si wafer 1 to introduce a mixed backside gas 13. The tube 10B has inlets for introducing the argon gas 9 and ethylene gas 12 and an outlet at the surface of the susceptor 2 in the vicinity of the edge portion of the Si wafer 1.

By the configuration as described above, the mixed backside gas 13 is supplied onto the backside and edge of the S1 wafer 1, the mixed back-side gas 13 containing the argon (At) gas 9 at a rate of 2000 sccm and the ethylene gas 12 at a rate of 2 to 7 percent by flow rate of the Ar gas 9, as shown in FIG. 4B. The source gas 4 containing $WF_6$ at a rate of 10 to 100 sccm and a reducing $H_2$ gas at a rate of 100 to 2000 sccm is supplied from the tube 10 through the showerhead 3 onto the entire main surface of the Si wafer 1, which is heated beforehand by the susceptor 2 up to a temperature between 350° and 500° C.

The flow rate of the ethylene gas 12 in the mixed backside gas 13 is similar to that of the first embodiment, i.e., 2 to 7 percent of the flow rate of the argon gas 9. The ethylene gas 12 may be added into the argon gas 9 at any time so long as it is added prior to supplying the mixed gas 13 to the Si wafer 1. The ethylene gas 12 may be added before introducing the mixed gas 13 into the CVD reactor 11 or may be added to the argon gas 9 in a argon gas container not shown.

In the embodiments as described above, the ethylene gas is used as an organic compound providing active electrons for reaction with the halogen atoms in the source gas 4. Acetylene, butene, propylene etc. or a substituted product thereof may be used instead of the ethylene gas as an organic compound for providing active electrons. Further, a silane gas may be used instead of the organic compound to be added into the argon gas because $SiH_2$ radicals in the silane gas can be also reacted with halogen atoms.

Moreover, CVD metallic film is not limited to a tungsten film but extended to other metallic or alloy film such as WSi film, Ti film etc.

Since above embodiments are described only for examples, the present invention is not limited to such embodiments and it will be obvious for those skilled in the art that various modifications or alterations can be easily made based on the above embodiments within the scope of the present invention.

What is claimed is:

1. A CVD method including the steps of:
   introducing a wafer into a chamber, wherein the wafer includes an edge portion, and wherein the wafer includes at least when in the chamber a titanium film overlying the wafer and wherein a titanium nitride film overlies the titanium film,
   introducing a source gas containing a metallic halide into the chamber,
   decomposing at least a part of said metallic halide to generate a decomposed gas including metallic atoms and halogen atoms, supplying in a counterflow direction to the source gas directly to the edge portion of the wafer a mixed gas containing an inert gas and (i) an organic compound having π electrons that reacts with said halogen atoms or (ii) a silane gas containing $SiH_2$ radicals that reacts with said halogen atoms, to thereby suppress reaction of the titanium from the titanium film with the halogen atoms and supplying at least said decomposed gas and said mixed gas to the wafer to form a metallic film including said metallic atoms on the titanium nitride film.

2. A CVD method as defined in claim 1 wherein said source gas contains $WF_6$ at a flow rate of 10 to 100 sccm and $H_2$ gas at a flow rate of 100 to 2000 sccm and wherein said mixed gas contains said inert gas at a flow rate of 1000 to 3000 sccm and ethylene as said organic compound having π electrons at 2 to 7 percent of the flow rate of said inert gas.

3. A CVD method as defined in claim 1 wherein said mixed gas comprises said organic compound having π electrons which is selected from the group consisting of ethylene, acetylene, butene, and propylene.

4. A CVD method as claimed in claim 3, wherein the wafer is a silicon wafer having a circuit formed thereon.

5. A CVD method as defined in claim 1 wherein said mixed gas comprises said silane gas containing $SiH_2$ radicals.

6. A CVD method as claimed in claim 5, wherein the inert gas comprises argon.

7. A CVD method as defined in claim 1 wherein said metallic film is composed of W, WSi, or Ti.

8. A CVD method as defined in claim 1 wherein said wafer is heated up to a temperature between about 350° and 500° C. before forming said metallic film.

9. A CVD method as claimed in claim 1, comprising as an initial step of forming on the wafer either before or after entry into the chamber, said titanium film and said titanium nitride film.

10. A CVD method as claimed in claim 1, wherein said inert gas is introduced and flows at a rate of 1000 to 3000 sccm.

11. A CVD method as claimed in claim 1, wherein said mixed gas comprises said organic compound having π electrons which is an ethylene gas and said ethylene gas is introduced with said inert gas at a flow rate of 2 to 7 percent of the flow rate of said inert gas.

12. A CVD method as claimed in claim 1, wherein the metallic film is a tungsten film.

13. A CVD method as claimed in claim 1, wherein the introducing of the wafer into the chamber comprises mounting the wafer on a susceptor.

14. A CVD method as claimed in claim 1, wherein said metallic halide comprises a tungsten halide.

15. A CVD method as claimed in claim 1, wherein the decomposing is accomplished by heating, plasma, or light.

16. A CVD method as claimed in claim 1, wherein the source gas is supplied by a showerhead.

17. A CVD method as claimed in claim 1, wherein prior to forming of the metallic film on the titanium nitride film, edge portions of the titanium film are not covered by the titanium nitride film and therefore are exposed.

18. A CVD method as claimed in claim 1, wherein the halogen atoms comprise fluorine atoms.

* * * * *